United States Patent
Lee et al.

(10) Patent No.: US 10,424,681 B2
(45) Date of Patent: Sep. 24, 2019

(54) SOLAR CELL

(71) Applicant: LG ELECTRONICS INC., Seoul (KR)

(72) Inventors: Giwon Lee, Seoul (KR); Kisu Kim, Seoul (KR); Ilhyoung Jung, Seoul (KR); Jinah Kim, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 126 days.

(21) Appl. No.: 14/792,286

(22) Filed: Jul. 6, 2015

(65) Prior Publication Data

US 2016/0005900 A1 Jan. 7, 2016

(30) Foreign Application Priority Data

Jul. 7, 2014 (KR) .................. 10-2014-0084673

(51) Int. Cl.
*H01L 31/0475* (2014.01)
*H01L 31/068* (2012.01)
*H01L 31/0745* (2012.01)
*H01L 31/0747* (2012.01)
*H01L 31/0216* (2014.01)

(52) U.S. Cl.
CPC .... *H01L 31/0475* (2014.12); *H01L 31/02167* (2013.01); *H01L 31/0682* (2013.01); *H01L 31/0745* (2013.01); *H01L 31/0747* (2013.01); *Y02E 10/50* (2013.01)

(58) Field of Classification Search
CPC ....... H01L 31/02245; H01L 31/022458; H01L 31/0747; H01L 31/0682
See application file for complete search history.

(56) References Cited

U.S. PATENT DOCUMENTS

| | | | |
|---|---|---|---|
| 7,468,485 B1 | 12/2008 | Swanson | |
| 2004/0027774 A1* | 2/2004 | Takizawa | C22C 1/0433 361/143 |
| 2007/0256728 A1 | 11/2007 | Cousins | |

(Continued)

FOREIGN PATENT DOCUMENTS

| | | |
|---|---|---|
| CN | 101999175 A | 3/2011 |
| CN | 103367480 A | 10/2013 |

(Continued)

*Primary Examiner* — Eric R Smith
(74) *Attorney, Agent, or Firm* — Birch, Stewart, Kolasch & Birch, LLP

(57) ABSTRACT

A solar cell is discussed, which includes a tunneling layer on one surface of a semiconductor substrate; a first conductive type region on the tunneling layer; a second conductive type region on the tunneling layer; a first electrode and a second electrode, the first electrode connected to the first conductive type region and the second electrode connected to the second conductive type region. The tunneling layer includes a first portion and a second portion. The first portion is disposed to correspond to at least a part of the first and second conductive type regions and has a first thickness. At least a part of the second portion is disposed to correspond to a boundary portion between the first conductive type region and the second conductive type region. The second portion has a second thickness greater than the first thickness.

16 Claims, 10 Drawing Sheets

(56) References Cited

U.S. PATENT DOCUMENTS

| | | | |
|---|---|---|---|
| 2008/0072953 A1* | 3/2008 | Stephens | H01L 31/022441 136/249 |
| 2009/0308438 A1* | 12/2009 | De Ceuster | H01L 31/022441 136/255 |
| 2009/0314341 A1 | 12/2009 | Borden et al. | |
| 2011/0120552 A1 | 5/2011 | Meyer et al. | |
| 2011/0272012 A1 | 11/2011 | Heng et al. | |
| 2012/0042945 A1* | 2/2012 | Ji | H01L 31/0682 136/256 |
| 2015/0179836 A1* | 6/2015 | Sewell | H01L 31/022441 136/256 |
| 2015/0179838 A1* | 6/2015 | Rim | H01L 31/022441 136/256 |
| 2016/0284917 A1* | 9/2016 | Rim | H01L 31/02167 |

FOREIGN PATENT DOCUMENTS

| | | |
|---|---|---|
| JP | 2009-535845 A | 10/2009 |
| KR | 10-2009-0009224 A | 1/2009 |
| KR | 10-2010-0136542 A | 12/2010 |
| KR | 10-2011-0005898 A | 1/2011 |
| KR | 10-2013-0064456 A | 6/2013 |

* cited by examiner

SOLAR CELL

CROSS-REFERENCE TO RELATED APPLICATION

This application claims the priority benefit of Korean Patent Application No. 10-2014-0084673, filed on Jul. 7, 2014 in the Korean Intellectual Property Office, the disclosure of which is incorporated herein by reference.

BACKGROUND OF THE INVENTION

1. Field of the Invention

Embodiments of the invention relate to a solar cell and, more particularly, to a solar cell having a tunneling structure.

2. Description of the Related Art

In recent years, as conventional energy resources such as petroleum and coal are running out, interest in alternative energy resources replacing these energy resources is on the rise. Of these, solar cells are attracting considerable attention as next generation cells which convert solar energy into electrical energy.

Such a solar cell is manufactured by forming various layers and electrodes according to design. Efficiency of solar cells may be determined according to the design of various layers and electrodes. Low efficiency should be overcome so that solar cells can be put to practical use. Accordingly, various layers and electrodes should be designed such that solar cell efficiency is maximized.

SUMMARY OF THE INVENTION

Embodiments of the invention provide solar cells having enhanced efficiency.

A solar cell according to an embodiment of the invention includes a semiconductor substrate; a tunneling layer on one surface; of the semiconductor substrate; a first conductive type region on the tunneling layer, the first conductive type region having a first conductive type; a second conductive type region on the tunneling layer, the second conductive type region having a second conductive type; a first electrode and a second electrode, the first electrode connected to the first conductive type region and the second electrode connected to the second conductive type region. The tunneling layer includes a first portion and a second portion. The first portion is disposed to correspond to at least a part of the first and second conductive type regions and has a first thickness. At least a part of the second portion is disposed to correspond to a boundary portion between the first conductive type region and the second conductive type region. The second portion has a second thickness greater than the first thickness.

BRIEF DESCRIPTION OF THE DRAWINGS

The above and other objects, features and other advantages of the invention will be more clearly understood from the following detailed description taken in conjunction with the accompanying drawings, in which.

DETAILED DESCRIPTION OF THE EMBODIMENTS

Figure 1:
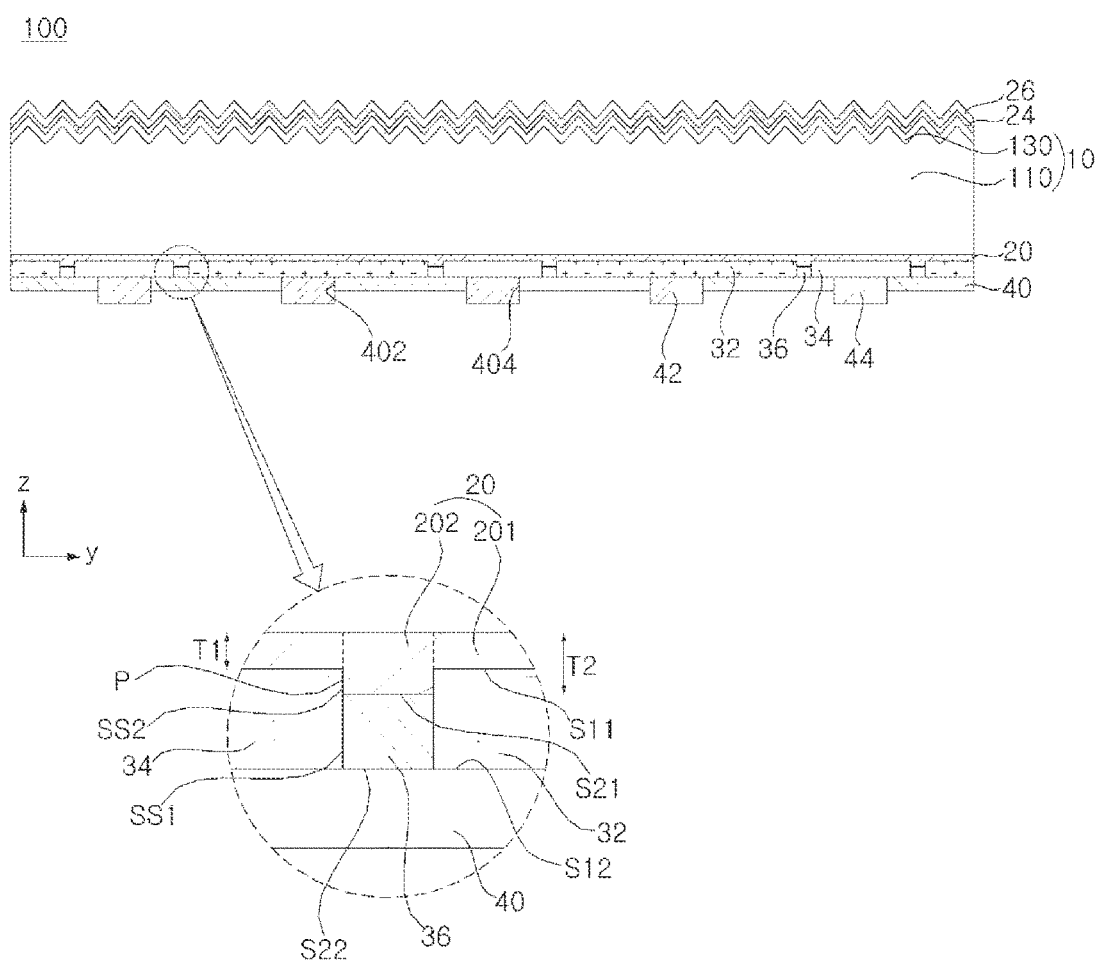
FIG. 1 is a sectional view of a solar cell according to an embodiment of the invention.

Reference will now be made in detail to embodiments of the invention, examples of which are illustrated in the accompanying drawings. However, the invention may be embodied in many different forms and should not be construed as limited to the embodiments of the invention set forth herein.

Only elements constituting features of the invention are illustrated in the accompanying drawings and other elements that are not features of the invention will not be described herein, and are omitted from the drawings, for clarity of description. Like reference numerals refer to like elements throughout. In the drawings, the thicknesses, areas, etc., of constituent elements may be exaggerated or reduced for clarity and convenience of illustration. The invention is not limited to the illustrated thicknesses, areas, etc.

It will be further understood that, throughout this specification, when one element is referred to as "comprising" or "including" another element, the term "comprising" or "including" specifies the presence of another element but does not preclude the presence of other additional elements, unless context clearly indicates otherwise. In addition, it will be understood that when one element such as a layer, a region or a plate is referred to as being "on" another element, the one element may be directly on the another element, and one or more intervening elements may also be present. In contrast, when one element such as a layer, a region or a plate is referred to as being "directly on" another element, one or more intervening elements are not present.

Hereinafter, solar cells according to embodiments of the invention will be described in detail with reference to the accompanying drawings.

Figure 2:
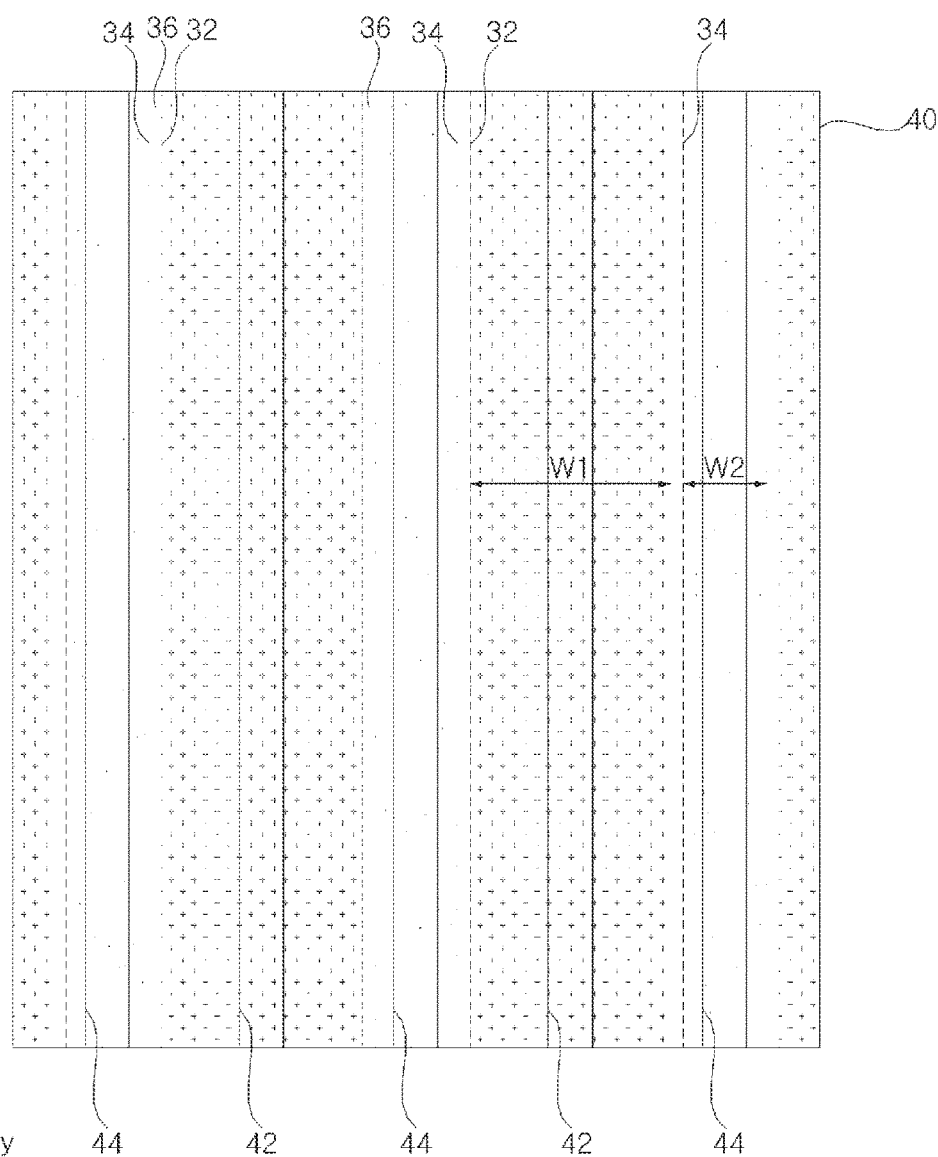
FIG. 2 is a partial rear plan view of the solar cell illustrated in FIG. 1.

FIG. 1 is a sectional view of a solar cell according to an embodiment of the invention, and FIG. 2 is a partial rear plan view of the solar cell illustrated in FIG. 1.

Referring to FIGS. 1 and 2, a solar cell 100 according to the embodiment of the invention includes a semiconductor substrate including a base region 110, a tunneling layer 20 on the semiconductor substrate 10, conductive type regions 32 and 34 on the tunneling layer 20, and electrodes 42 and 44 connected to the conductive type regions 32 and 34. In this instance, the conductive type regions 32 and 34 may include a first conductive type region 32 having a first conductive type and a second conductive type region 34 having a second conductive type. A barrier region 36 may be disposed between the first conductive type region 32 and the second conductive type region 34. The electrodes 42 and 44 may include a first electrode 42 connected to the first conductive type region 32 and a second electrode 44 connected to the second conductive type region 30. The solar cell 100 may further include a passivation layer 24, an anti-reflective layer 26, an insulating layer 40 and the like. This will be described in more detail.

The semiconductor substrate 10 may include the base region 110 including the second conductive type dopant (of dopants) at a relatively low doping concentration to have the second conductive type. The base region 110 may include crystalline semiconductor including the second conductive type dopant. For example, the base region 110 may include single-crystalline or polycrystalline semiconductor (for example, single-crystalline or polycrystalline silicon) including the second conductive type dopant. Particularly, the base region 110 may be a single-crystalline semiconductor (e.g., a single-crystalline wafer, more particularly, a single-crystalline silicon wafer) including the second conductive type dopant. When the base region 110 includes the single-crystalline silicon, the solar cell 100 is a single-crystalline silicon solar cell. The solar cell 100 is based on the base region 110 or the semiconductor substrate 10 including the single-crystalline silicon with a high degree of crystallinity and a low degree of defects, and thus, the solar cell 100 has an enhanced electrical property.

The second conductive type dopant may be of an n-type or a p-type. For example, when the base region 110 is of an n-type, the first conductive type region 32 of a p-type is used to form a junction (e.g., a pn junction with the tunneling layer 20 disposed therebetween) that forms carriers by photoelectric conversion with the base region 110 has a wide area and thus a photoelectric conversion area may be increased. In addition, in this instance, the first conductive type region 32 having a wide area effectively collects holes having a relatively slow movement rate and thus may further contribute to improvement in photoelectric conversion efficiency. However, the embodiment of the invention is not limited to the above examples.

In addition, the semiconductor substrate 10 may include a front surface field region 130 at a front surface thereof. The front surface field region 130 may have the same conductive type as that of the base region 110 and a higher doping concentration than the base region 110.

In the embodiment of the invention, the front surface field region 130 is a doping region formed by doping the semiconductor substrate 10 with a second conductive type dopant at a relatively high doping concentration. Accordingly, the front surface field region 130 constitutes the semiconductor substrate 10, including a crystalline (single-crystalline or polycrystalline) semiconductor of the second conductive type. For example, the front surface field region 130 may be formed as a portion of a single-crystalline semiconductor substrate (e.g., a single-crystalline silicon wafer substrate) of a second conductive type. However, the embodiment of the invention is not limited to the above examples. Thus, the front surface field region 130 may be formed by doping a separate semiconductor layer from the semiconductor substrate 10 (e.g., an amorphous semiconductor layer, a microcrystalline semiconductor layer, or a polycrystalline semiconductor layer) with a second conductive type dopant. In another embodiment of the invention, the front surface field region 130 may be a field region that acts similarly to a region formed through doping by fixed charges of a layer (e.g., the passivation layer 24 and/or the anti-reflective layer 26) formed adjacent to the semiconductor substrate 10. For example, when the base region 110 is the n-type, the passivation layer 24 may include an oxide having fixed negative charge (for example, an aluminum oxide) to form an inversion layer at the surface of the base region 110. The inversion layer may be used for the field region. In this case, the semiconductor substrate 10 does not include an additional doping region and consists of the base region 110, and thus, the defect of the semiconductor substrate 10 can be minimized. The front surface field region 130 having various structures may be formed using various other methods.

In the embodiment of the invention, the front surface of the semiconductor substrate 10 may be textured to have an uneven surface (or protruded portions and/or depressed portions) in the form of a pyramid, or the like. Through the texturing process, the uneven portion is formed at the front surface of the semiconductor substrate 10 and thus surface roughness thereof increases, whereby reflectance of light incident upon the front surface of the semiconductor substrate 10 may be reduced. Accordingly, the amount of light reaching a pn junction formed by the base region 110 and the first conductive type region 32 may be increased and, consequently, light loss may be minimized.

Meanwhile, the back surface of the semiconductor substrate 10 may be a relatively smooth and even surface formed by mirror polishing or the like and having a lower surface roughness than the front surface of the semiconductor substrate 10. As in the embodiment of the invention, when the first and second conductive type regions 32 and 34 are formed together on the back surface of the semiconductor substrate 10, characteristics of the solar cell 100 may largely vary according to characteristics of the back surface of the semiconductor substrate 10. Since an uneven portion by texturing is not formed at the back surface of the semiconductor substrate 10, passivation characteristics may be enhanced and, accordingly, the characteristics of the solar cell 100 may be enhanced. However, the embodiment of the invention is not limited to the above example. In some instances, an uneven portion may be formed at the back surface of the semiconductor substrate 10 by texturing. In addition, various modifications are possible.

The tunneling layer 20 may be formed on the back surface of the semiconductor substrate 10. The tunneling layer 20 acts as a kind of a barrier to electron and hole. Thus, minority carriers cannot pass through the tunneling layer 20. Meanwhile, majority carriers are accumulated at a portion adjacent to the tunneling layer 20, and then, the majority carriers having the predetermined energy passes through the tunneling layer 20. In this instance, the majority carriers having the predetermined energy can easily and smoothly pass through the tunneling layer 20 by a tunneling effect. Also, the tunneling layer 20 also acts as a diffusion barrier for preventing the dopant of the conductive type regions 32 and 34 from diffusing into the semiconductor substrate 10.

In the embodiment of the invention, the tunneling layer 20 may have a first portion 201 and a second portion 202 having different thicknesses to each other. The tunneling layer 20 having the first and second portions 201 and 202 will be described in more detail after the conductive type regions 32 and 34, and the barrier region 36 are described.

The conductive type regions 32 and 34 may be disposed on the tunneling layer 20. More particularly, the conductive type regions 32 and 34 may include the first conductive type region 32 including the first conductive type dopant thus having the first conductive type, and the second conductive type region 34 including the second conductive type dopant thus having the second conductive type. In addition, the barrier region 36 may be disposed between the first and second conductive type regions 32 and 34.

The first conductive type region 32 forms a pn junction (or pn tunnel junction) with the base region 110 while disposing the tunneling layer 20 therebetween and thus constitutes an emitter region that generates carriers by photoelectric conversion.

In this regard, the first conductive type region 32 may include a semiconductor (e.g., silicon) including the first conductive type dopant opposite the base region 110. In the embodiment of the invention, the first conductive type region 32 is formed separately from the semiconductor substrate 10, on the semiconductor substrate 10 (more particularly, on the tunneling layer 20). The first conductive type region 32 may be formed as a semiconductor layer doped with the first conductive type dopant. Thus, the first conductive type region 32 may be formed as a semiconductor layer having a different crystal structure than the semiconductor substrate 10 so as to be easily formed on the semiconductor substrate 10. For example, the first conductive type region 32 may be formed by doping an amorphous semiconductor, micro-crystalline semiconductor or polycrystalline semiconductor (e.g., amorphous silicon, micro-crystalline silicon, or polycrystalline silicon) that may be easily manufactured by various methods such as deposition and the like, with a first conductive type dopant. The first conductive type dopant may be included in the semiconductor layer when forming the semiconductor layer or may be included in the semiconductor layer by various doping methods such as thermal diffusion, ion implantation, and the like after forming the semiconductor layer.

In this regard, the first conductive type dopant may be any dopant having a conductive type opposite the base region 110. That is, when the first conductive type dopant is of a p-type, the first conductive type dopant may be a Group III element such as B, Al, Ga, In, or the like. When the first conductive type dopant is of an n-type, the first conductive type dopant may be a Group V element such as P, As, Bi, Sb, or the like.

The second conductive type region 34 forms a back surface field and thus forms a back surface field region that prevents loss of carriers by recombination at a surface (more particularly, the back surface) of the semiconductor substrate 10.

In this regard, the second conductive type region 34 may include a semiconductor (e.g., silicon) including the same second conductive type dopant as that of the base region 110. In the embodiment of the invention, the second conductive type region 34 is formed separately from the semiconductor substrate 10, on the semiconductor substrate 10 (more particularly, on the tunneling layer 20). The second conductive type region 34 is formed as a semiconductor layer doped with a second conductive type dopant. Thus, the second conductive type region 34 may be formed as a semiconductor layer having a different crystal structure than the semiconductor substrate 10 so as to be easily formed on the semiconductor substrate 10. For example, the second conductive type region 34 may be formed by doping an amorphous semiconductor, micro-crystalline semiconductor or polycrystalline semiconductor (e.g., amorphous silicon, micro-crystalline silicon, or polycrystalline silicon) that may be easily manufactured by various methods such as deposition and the like, with a second conductive type dopant. The second conductive type dopant may be included in the semiconductor layer when forming the semiconductor layer or may be included in the semiconductor layer by various doping methods such as thermal diffusion, ion implantation, and the like after forming the semiconductor layer.

In this regard, the second conductive type dopant may be any dopant having the same conductive type as that of the base region 110. That is, when the second conductive type dopant is of an n-type, the second conductive type dopant may be a Group V element such as P, As, Bi, Sb, or the like. When the second conductive type dopant is of a p-type, the second conductive type dopant may be a Group III element such as B, Al, Ga, In, or the like.

In addition, the barrier region 36 is disposed between the first and second conductive type regions 32 and 34 to separate the first conductive type region 32 from the second conductive type region 34. When the first and second conductive type regions 32 and 34 are in contact with each other, shunting may occur and, accordingly, performance of the solar cell 100 may be deteriorated. Thus, in the embodiment of the invention, the barrier region 36 may be disposed between the first and second conductive type regions 32 and 34 to prevent unnecessary or unwanted occurrence of shunting.

The barrier region 36 may include various materials enabling the first and second conductive type regions 32 and 34 to be substantially insulated from each other. That is, the barrier region 36 may be formed of an undoped insulating material (e.g., an oxide or a nitride). In another embodiment of the invention, the barrier region 36 may include an intrinsic semiconductor. In this regard, the first and second conductive type regions 32 and 34, and the barrier region 36 are continuously formed so that side surface of the first and second conductive type regions 32 and 34 are in contact with side surfaces of the barrier region 36. The first and second conductive type regions 32 and 34, and the barrier region 36 may be formed of the same semiconductor (e.g., amorphous silicon, micro-crystalline silicon, or polycrystalline silicon), and the barrier region 36 may not include a dopant. For example, a semiconductor layer including a semiconductor material may be formed, a region of the semiconductor layer is doped with a first conductive type dopant to form the first conductive type region 32, another region thereof is doped with a second conductive type dopant to form the second conductive type region 34, and the barrier region 36 may be formed in a region of the semiconductor layer in which the first and second conductive type regions 32 and 34 are not formed. According to the embodiment of the invention, a manufacturing method of the first and second conductive type regions 32 and 34, and the barrier region 36 may be simplified.

However, the embodiment of the invention is not limited to the above examples. That is, when the barrier region 36 is formed separately from the first and second conductive type regions 32 and 34, the barrier region 36 may have a different thickness than that of the first and second conductive type regions 32 and 34. For example, to more effectively prevent a short circuit between the first and second conductive type regions 32 and 34, the thickness of the barrier region 36 may be greater than that of the first and second conductive type regions 32 and 34. In another embodiment of the invention, to reduce raw material costs for forming the barrier region 36, the thickness of the barrier region 36 may be less than that of the first and second conductive type regions 32 and 34. In addition, various modifications are possible. In addition, a base material of the barrier region 36 may be different than those of the first and second conductive type regions 32 and 34. In another embodiment of the invention, the barrier region 36 may be formed as an empty space (e.g., a trench) disposed between the first and second conductive type regions 32 and 34.

Also, in the embodiment of the invention, it is exemplified that the barrier region 36 separates the first conductive type region 32 and the second conductive type region 34. However, the embodiment of the invention is not limited thereto.

Therefore, the barrier region 36 may be formed so as to partially separate the first and second conductive type regions 32 and 34 at an interface therebetween from each other. Thus, some portion of the interface between the first and second conductive type regions 32 and 34 may be separated from each other, while the other portion of the interface between the first and second conductive type regions 32 and 34 may contact each other. This will be described in more detail with reference to FIG. 7 and FIG. 8. In addition, the barrier region 36 may not be necessarily formed, and the first and second conductive type regions 32 and 34 may entirely contact each other. In addition, various modifications are possible.

In this regard, the second conductive type region 34 having the same conductive type as that of the base region 110 may have a narrower area than that of the first conductive type region 32 having a different conductive type than that of the base region 110. Thus, a pn junction formed between the base region 110 and the first conductive type region 32 via the tunneling layer 20 may have a wider area. In this regard, when the base region 110 and the second conductive type region 34 are n-type conductive and the first conductive type region 32 is p-type conductive, the first conductive type region 32 having a wide area may effectively collect holes having a relatively slow movement rate. The planar structure of the first and second conductive type regions 32 and 34, and the barrier region 36 will be described below in further detail with reference to FIG. 2.

The insulating layer 40 may be formed on the first and second conductive type regions 32 and 34, and the barrier region 36. The insulating layer 40 includes a first opening (or first openings) 402 to connect the first conductive type region 32 and the first electrode 42 and a second opening (second openings) 404 to connect the second conductive type region 34 and the second electrode 44. Thereby, the insulating layer 40 may prevent electrodes to which the first and second conductive type regions 32 and 34 must not be connected (i.e., the second electrode 44 for the first conductive type region 32 and the first electrode 42 for the second conductive type region 34) from being connected to each other. In addition, the insulating layer 40 can passivate the conductive type regions 32 and 34 and/or the barrier region 36.

The insulating layer 40 may be disposed where the electrodes 42 and 44 are not formed. The insulating layer 40 has a thickness larger than the tunneling layer 20 (more particularly, the first portion 201 and the second portion 202 of the tunneling layer 20). Then, the insulating property and the passivation property can be enhanced. However, the embodiment of the invention is not limited thereto. The insulating layer 40 may have a thickness larger than a thickness of the first portion 201 and smaller or lesser than a thickness of the second portion 202. Other modifications may be possible.

For example, the insulating layer 40 may include various insulating materials (for example, an oxide, a nitride, and so on). For example, the insulating layer 40 may be any one film selected from the group consisting of a silicon nitride film, a hydrogen-containing silicon nitride film, a silicon oxide film, a silicon oxynitride film, an aluminum oxide film, a $MgF_2$ film, a ZnS film, a $TiO_2$ film, and a $CeO_2$ film or have a multilayer structure including two or more of the above-listed films in combination. However, the embodiment of the invention is not limited thereto, and thus, the insulating layer 40 may include one or more of various materials.

The electrodes 42 and 44 disposed on the back surface of the semiconductor substrate 10 include the first electrode 42 electrically and physically connected to the first conductive type region 32 and the second electrode 44 electrically and physically connected to the second conductive type region 34.

In the embodiment of the invention, the first electrode 42 is connected to the first conductive type region 32 through penetrating of the first opening 402 of the insulating layer 40. The second electrode 44 is connected to the second conductive type region 34 through penetrating of the second opening 404 of the insulating layer 40. The first and second electrodes 42 and 44 may include one or more of various metal materials. In addition, the first and second electrodes 42 and 44 are not electrically connected to each other but are respectively connected to the first conductive type region 32 and the second conductive type region 34, and may have various planar shapes enabling collection of carriers that are generated, and transfer of the collected carriers to the outside. However, the shapes of the first and second electrodes 42 and 44 are not limited to the above example.

Hereafter, planar shapes of the first and second conductive type regions 32 and 34, the barrier region 36, and the first and second electrodes 42 and 44 will be described in detail with reference to FIGS. 1 and 2.

Referring to FIG. 1 and FIG. 2, in the embodiment of the invention, the first and second conductive type regions 32 and 34 are extended so as to have a stripe shape and alternately disposed with respect to each other in a direction crossing a longitudinal direction. The barrier region 36 may be disposed to separate the first conductive type region 32 from the second conductive type region 34. Plural first conductive type regions 32 separated from each other may be connected to each other at an edge of a first side thereof, and plural second conductive type regions 34 separated from each other may be connected to each other at an edge of a second side thereof. However, the embodiment of the invention is not limited to the above examples.

In this regard, the first conductive type region 32 may have a wider area than the second conductive type region 34. For example, the areas of the first and second conductive type regions 32 and 34 may be adjusted by differently adjusting widths thereof. That is, a width W1 of the first conductive type region 32 may be greater than a width W2 of the second conductive type region 34.

In addition, the first electrode 42 may be formed so as to have a stripe shape to correspond to the first conductive type region 32, and the second electrode 44 may be formed so as to have a stripe shape to correspond to the second conductive type region 34. The first and second openings 402 and 404 may be formed to respectively correspond to total lengths of the first and second electrodes 42 and 44. Thus, a contact area between the first electrode 42 and the first conductive type region 32 and a contact area between the second electrode 44 and the second conductive type region 34 are maximized and, accordingly, carrier collection efficiency may be enhanced. However, the embodiment of the invention is not limited to the above examples. In addition, the first and second openings 402 and 404 may also be formed so as to respectively connect only portions of the first and second electrodes 42 and 44 to the first and second conductive type regions 32 and 34. For example, the first and second openings 402 and 404 may be formed as a plurality of contact holes. The first electrodes 42 may be connected to each other at an edge of a first side thereof, and the second electrodes 44 may be connected to each other at an edge of a second side thereof. However, the embodiment of the invention is not limited to the above examples.

Referring back to FIG. 1, the passivation layer 24 and/or the anti-reflective layer 26 may be disposed on the front surface of the semiconductor substrate 10 (more particularly, the front surface field region 130 formed at the front surface of the semiconductor substrate 10). According to embodiments of the invention, only the passivation layer 24 may be formed on the semiconductor substrate 10, only the anti-reflective layer 26 may be formed on the semiconductor substrate 10, or the passivation layer 24 and the anti-reflective layer 26 may be sequentially disposed on the semiconductor substrate 10. FIG. 2 illustrates an instance in which the passivation layer 24 and the anti-reflective layer 26 are sequentially formed on the semiconductor substrate 10 and the semiconductor substrate 10 contacts the passivation layer 24. However, the embodiment of the invention is not limited to the above examples, and the semiconductor substrate 10 may contact the anti-reflective layer 26. In addition, various modifications are possible.

The passivation layer 24 and the anti-reflective layer 26 may be substantially entirely formed on the front surface of the semiconductor substrate 10. In this regard, the expression "entirely formed" as used herein includes an instance in which the passivation layer 24 and the anti-reflective layer 26 are physically completely formed and an instance in which the passivation layer 24 and the anti-reflective layer 26 are incompletely formed by an unavoidable reason.

The passivation layer 24 is formed on the front surface of the semiconductor substrate 10 in contact therewith and thus inactivates or passivates defects present in the front surface or bulk of the semiconductor substrate 10. Thus, recombination sites of minority carriers are removed or reduced and, accordingly, an open circuit voltage of the solar cell 100 may be increased. Thus, the amount of light reaching a pn junction formed at an interface between the base region 110 and the first conductive type region 32 may be increased by reducing the reflectance of light incident upon the front surface of the semiconductor substrate 10. Accordingly, a short-circuit current Isc of the solar cell 100 may be increased. As such, the open circuit voltage and the short-circuit current Isc of the solar cell 100 may be increased by the passivation layer 24 and the anti-reflective layer 26 and, accordingly, the efficiency of the solar cell 100 may be enhanced.

The passivation layer 24 and/or the anti-reflective layer 26 may be formed of various materials. For example, the passivation layer 24 and/or the anti-reflection layer 26 may be any one layer selected from the group consisting of a silicon nitride layer, a hydrogen-containing silicon nitride layer, a silicon oxide layer, a silicon oxynitride layer, an aluminum oxide layer, a $MgF_2$ layer, a ZnS layer, a $TiO_2$ layer, and a $CeO_2$ layer, or have a multilayer structure including two or more of the above-listed layers in combination. For example, the passivation layer 24 may include silicon oxide, and the anti-reflective layer 26 may include silicon nitride.

The tunneling layer 20 will be described again. In the embodiment of the invention, the tunneling layer 20 may include the first portion 201 and the second portion 202. The first portion 201 is disposed to correspond to at least a part of the first and second conductive type regions 32 and 34 and has a first thickness T1. The second portion 202 is disposed to correspond to a boundary portion between the first conductive type region 32 and the second conductive type region 34, and has a second thickness T2 larger than the first thickness T1. Accordingly, a step is formed or a gap is existed between the first portion 201 and the second portion 202. In the embodiment of the invention, the barrier region 36 is entirely positioned at a boundary portion between the first conductive type region 32 and the second conductive type region 34, and the second portion 202 is positioned to correspond to the barrier region 36.

The barrier region 36 between the first and second conductive type regions 32 and 34 prevents unnecessary or unwanted occurrence of shunting between the first and second conductive type regions 32 and 34. However, when the carrier of the semiconductor substrate 10 (particularly, majority carrier of the semiconductor substrate, for example, an electron when the semiconductor substrate 10 is the n-type) is transferred to the barrier region 36 through the tunneling layer 20 by a tunneling, the carrier transferred to the barrier region 36 by the tunneling may be recombined with the carrier of the first conductive type region 32 having the conductive type opposite to the semiconductor substrate 10 (particularly, majority carrier of the first conductive type region 32, for example, a hole when the first conductive type region is the p-type) at the boundary surface between the first conductive type region 32 and the barrier region 36. Then, the open circuit voltage of the solar cell 100 may be reduced, and thus, the efficiency of the solar cell may be reduced.

Accordingly, in the embodiment of the invention, a portion the tunneling layer 20 corresponding to at least apart of the barrier region 36 where the tunneling of the carrier is not necessary has a relatively large thickness (that is, the second thickness T2). The tunneling probability through the tunneling layer 20 largely decreases as the thickness of the tunneling layer 20 increases. Thus, by positioning the second portion 202 having the relatively large thickness (that is, the second thickness T2) to correspond to at least the part of the barrier region 36, the carrier tunneling through the barrier region 36 can be effectively prevented.

That is, the first portion 201 having a relatively small thickness is positioned at a portion of the tunneling layer 20 corresponding to the first and second conductive type regions 32 and 34 where the tunneling is necessary. Thus, the tunneling probability to the first and second conductive type regions 32 and 34 can be enhanced. Meanwhile, the second portion 202 having a relatively large thickness is positioned at a portion of the tunneling layer 20 corresponding to the barrier region 36 where the tunneling is not necessary. Thus, the recombination that may be induced by the unnecessary or unwanted tunneling can be prevented. Accordingly, the properties of the solar cell 100 can be enhanced and the efficiency of the solar cell 100 can be maximized.

The first thickness T1 of the first portion 201 may be determined so that the carrier tunneling can be sufficiently induced through the first portion 201. The second thickness T2 of the second portion 202 may be determined to be thicker than the first thickness T1 so that the tunneling probability through the second portion 202 can be reduced than the tunneling probability through the first portion 201.

In this instance, the first thickness T1 of the first portion 201 may be smaller than the thickness of the first and second conductive type regions 32 and 34. This is because the first portion 201 is thin enough to allow sufficient carrier tunneling, and the first and second conductive type regions 32 and 34 have the predetermined thickness to sufficiently generate the photoelectric conversion.

Also, the second thickness T2 of the second portion 202 may be smaller than the thickness of the first and second conductive type regions 32 and 34. Since the tunneling through the tunneling layer 20 is sufficiently induced when the tunneling layer 20 is very thin, it is sufficient that the second portion 202 has a thickness larger than the predetermined thickness in order to reduce or prevent the tunneling, and the effect for reducing or preventing the tunneling are not largely increased over the predetermined thickness. Also, if the second thickness T2 of the second portion 202 is larger than the thickness of the first and second conductive type regions 32 and 34, it may be difficult to form the tunneling layer 20 having the structure and to form the first and second conductive type regions 32 and 34, and the barrier region 36 on the tunneling layer 20 having the structure. For example, the ratio of the thickness of the first and/or second conductive type region 32 and 34:the second thickness T2 of the second portion 202 may be in a range from about 1:0.005 to about 1:0.5. When the ratio is smaller than about 1:0.005, the effect by the second portion 202 may be not sufficient. When the ratio is larger than about 1:0.5, stability of the tunneling layer 20 may be deteriorated. However, the embodiment of the invention is not limited thereto. Thus, the second portion 202 may be thicker than the first and/or the second conductive type region 32 and 34, and the above ratio may have various values.

Also, the first thickness T1 of the first portion 201 may be smaller than the thickness of the passivation layer 24 and/or the insulating layer 40. This is because the first portion 201 is thin enough to allow sufficient carrier tunneling, and the passivation layer 24 and/or the insulating layer 40 have the predetermined thickness for the passivation property or the insulating property.

In addition, the second thickness T2 of the second portion 202 may be smaller than the thickness of the passivation layer 24 and/or the insulating layer 40. Since the tunneling through the tunneling layer 20 is sufficiently induced when the tunneling layer 20 is very thin, it is sufficient that the second portion 202 has a thickness larger than the predetermined thickness in order to reduce or prevent the tunneling, and the effect for reducing or preventing are not largely increased over the predetermined thickness. However, the embodiment of the invention is not limited thereto. Thus, the second portion 202 may be thicker than the passivation layer 24 and/or the insulating layer 40, and various modifications are possible.

For example, the first thickness T1 may be in a range from about 0.5 nm to about 2 nm, and the second thickness T2 may be in a range from about 2 nm to about 100 nm. When the first thickness T1 is smaller than about 0.5 nm, it may be difficult to form the tunneling layer having the high quality. When the first thickness T1 is larger than about 2 nm, the carrier tunneling may be not sufficient. In order to expedite the carrier tunneling, the first thickness T1 may be in a range from about 0.5 nm to about 1 nm. When the second thickness T2 is smaller than about 2 nm, the effect for reducing or preventing the tunneling may be not sufficient. When the second thickness T2 is larger than about 100 nm, it may be difficult to form the tunneling layer 20 having the structure and to form the first and second conductive type regions 32 and 34, and the barrier region 36 on the tunneling layer 20 having the structure. So as to easily form the tunneling layer 20, the conductive type regions 32 and 34, and the barrier region 36, the second thickness T2 may be in a range from about 2 nm to about 10 nm. However, the embodiment of the invention is not limited thereto, and thus, the first thickness T1 and the second thickness T2 may be varied.

In the embodiment of the invention, the first portion 201 and the second portion 202 may be formed by the same process. Then, the first portion 201 and the second portion 202 constitute one body or a single layer having an integrated structure and having the same material. Selectively, the first portion 201 and the second portion 202 may be formed by the different processes. Then, the first portion 201 and the second portion 202 may have the same material or the different materials. In this instance, the materials of the first and second portions 201 and 202 are varied according to a manufacturing process of the tunneling layer 20, and this will be described later with reference to FIGS. 3a to 3i, and FIGS. 4a and 4b.

The tunneling layer 20 may include one or more of various materials (such as, an oxide, a nitride, a carbide, and so on) to allow carrier tunneling. For example, each of the first and second portions 201 and 202 may include at least one of a silicon oxide, a silicon nitride, a silicon carbide, and an aluminum oxide, and the first and second portions 201 and 202 may include the same material or different materials. When the first and/or the second portion 201 and 202 includes the silicon oxide, an interface trap density (Dit) can decreases. When the first and/or the second portion 201 and 202 includes the silicon nitride or the aluminum oxide, an field effect induced by fixed charge can be used.

Particularly, the first portion 201 may include the silicon oxide. The first portion 201 having the silicon oxide may be formed of a silicon oxide layer naturally formed by a chemical reaction with the semiconductor substrate 10 and external oxygen through a thermal oxidation after forming the second portion 202 by an additional deposition and so on. Then, the first portion 201 can be manufactured by a simple process. However, the embodiment of the invention is not limited thereto, and thus, each of the first and second portions 201 and 202 may include one or more of various materials.

By the structure of the tunneling layer 20, a step P (or a gap) is formed between a first surface S21 of the barrier region 36 adjacent to the second portion 202 and a first surface S11 of the first and second conductive type regions 32 and 34 adjacent to the first portion 201. More particularly, the first surface S11 of the first and second conductive type regions 32 and 34 may be protruded to the semiconductor substrate 10 more than the first surface S21 of the barrier region 36. This is because the tunneling layer 20 includes the first and second portions 201 and 202.

Also, in the embodiment of the invention, a second surface S22 of the barrier region 36 opposite to the first surface S21 of the barrier layer 36 and a second surface S12 of the first and second conductive type regions 32 and 34 opposite to the first surface S11 of the first and second conductive type regions 32 and 34 may be continuously formed without a step. This is because a semiconductor layer 30 (refer to FIG. 3e) is formed to cover the tunneling layer 20, the first and second conductive type regions 32 and 34 are formed by doping, and the undoped region is used for the barrier region 36. In this instance, the second surface S22 of the barrier region 36 may be flush (or aligned) with or be on the same plane with the second surface S12 of the first and second conductive type regions 32 and 34. Thus, the second surface S22 of the barrier region 36 and the second surface S12 of the first and second conductive type regions and 34 may constitute a flat plane. This is because the semiconductor layer 30 for forming the first and second conductive type regions 32 and 34, and the barrier region 36 is sufficiently thick, and thus, the second surface S22 of the barrier region 36 and the second surface S12 of the first and second conductive type regions 32 and 36 that are not adjacent to the tunneling layer 20 constitute the flat plane regardless to the step P. However, the embodiment of the invention is not limited thereto, and thus, the step or the gap may be formed between the second surface S22 of the barrier region 36 and the second surface S12 of the first and second conductive type regions 32 and 34. This will be described in more detail later with reference to FIG. 9.

In addition, side surfaces SS1 of the barrier region 36 may be flush (or aligned) with or be on the same plane with side surfaces SS2 of the second portion 202. That is, the second portion 202 has the same shape and the same area with the barrier 36, and thus, the second portion 202 is positioned to the same position as the barrier region 36 to entirely overlap with the barrier region 36. However, the embodiment of the invention is not limited thereto. Thus, the side surfaces SS1 of the barrier region 36 may be misaligned (or not flush) with or deviate from the side surfaces SS2 of the second portion 202. This will be described in more detail later with reference FIGS. 5 and 6.

When light is incident upon the solar cell 100 according to the embodiment of the invention, electrons and holes are generated by photoelectric conversion at the pn junction formed between the base region 110 and the first conductive type region 32, and the generated holes and electrons tunnel by tunneling through the tunneling layer 20, respectively move to the first and second conductive type regions 32 and 34 and then respectively migrate to the first and second electrodes 42 and 44. Electric energy is generated thereby.

As in the embodiment of the invention, in the solar cell 100 having a back contact structure in which the first and second electrodes 42 and 44 are formed on the back surface of the semiconductor substrate 10 and not formed on the front surface of the semiconductor substrate 10, shading loss at the front surface of the semiconductor substrate 10 may be minimized. Accordingly, efficiency of the solar cell 100 may be enhanced. However, the embodiment of the invention is not limited to the above examples.

The first and second conductive type regions 32 and 34 are formed on the semiconductor substrate 10 while interposing the tunneling layer 20 therebetween to be separated from the semiconductor substrate 10. Accordingly, the loss due to the recombination can be minimized, compared with a doping region or doping regions formed by doping the semiconductor substrate 10 with dopants.

In this instance, the tunneling layer 20 includes the first portion 201 and the second portion 202 having different thicknesses. Thus, the tunneling probability can be highly maintained at a portion where the carrier tunneling is necessary, and also, the unnecessary or unwanted recombination due to the unnecessary or unwanted tunneling at a portion where the carrier tunneling is not necessary can be prevented. Accordingly, the properties of the solar cell 100 can be enhanced and the efficiency of the solar cell 100 can be maximized.

Hereinafter, the manufacturing method of the solar cell 100 having the above structure will be described in detail with reference to FIGS. 3a to 5i. FIGS. 3a to 5i are sectional views illustrating a method for manufacturing a solar cell according to an embodiment of the invention.

Figure 3A:
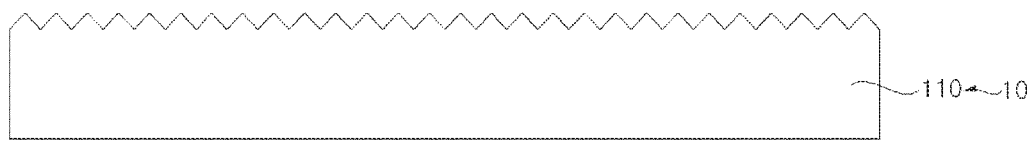
FIGS. 3a to 3i are sectional views illustrating a method for manufacturing a solar cell according to an embodiment of the invention.

First, as shown in FIG. 3a, a semiconductor substrate 10 including a base region 110 having a second conductive type dopant is prepared. In the embodiment of the invention, the semiconductor substrate 10 may be a silicon substrate (for example, a silicon wafer) having an n-type dopant. Examples of the n-type dopant include, but are not limited to, Group V elements such as phosphorous (P), arsenic (As), bismuth (Bi) and antimony (Sb). However, the embodiment of the invention is not limited thereto, and the base region 110 may have a p-type dopant.

At least one of the front and back surfaces of the semiconductor substrate 10 is textured so that the surface is an uneven surface (or have protruded portions and/or depressed portions). Wet or dry texturing method may be used as the texturing of the surface of the semiconductor substrate 10. Wet texturing may be carried out by dipping the semiconductor substrate 10 in a texturing solution and has an advantage of a short process time. Dry texturing is a process of cutting the surface of the semiconductor substrate 10 using a diamond drill, laser or the like and enables formation of uniform protruded portions and/or depressed portions, but disadvantageously has long process time and causes damage to the semiconductor substrate 10. Alternatively, the semiconductor substrate 10 may be textured by reactive ion etching (RIE) or the like. As such, the semiconductor substrate 10 may be textured by a variety of methods.

For example, the front surface of the semiconductor substrate 10 may be textured to have the protruded portions and/or depressed portions. Meanwhile, the back surface of the semiconductor substrate 10 may be a relatively smooth and even surface formed by mirror polishing or the like and having a lower surface roughness than the front surface of the semiconductor substrate 10. However, the embodiment of the invention is not limited thereto, and thus, the semiconductor substrate 10 having various structures may be used.

Figure 3B:
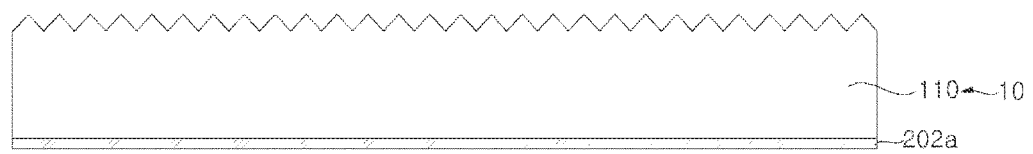
Figure 3C:
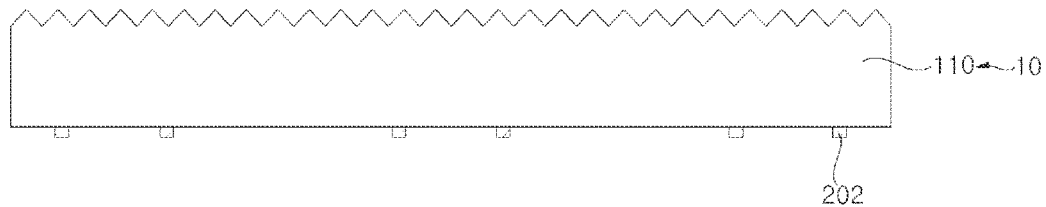
Figure 3D:
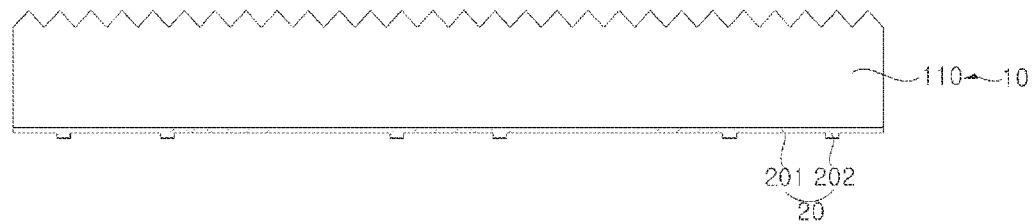

Then, as shown in FIGS. 3b to 3d, a tunneling layer 20 is formed on the rear surface of the semiconductor substrate 10. This will be described in more detail.

First, as shown in FIG. 3b, a tunneling forming layer 202a having a thickness corresponding to a second thickness T2 (refer to FIG. 1) of a second portion 202 (refer to FIG. 3c) is formed over an entire portion of the semiconductor substrate 10. The tunneling forming layer 202a may be formed by one of various methods. For example, the tunneling forming layer 202a may be formed by a method such as thermal growth or deposition (for example, plasma-enhanced chemical vapor deposition chemical (PECVD), atomic layer deposition (ALD)) or the like, but the embodiment of the invention is not limited thereto and the tunneling layer 20 may be formed by a variety of methods.

Next, as shown in FIG. 3c, a portion of the tunneling forming layer 202a except for a portion that will constitute the second portion 202 is removed by patterning the tunneling forming layer 202a, and then, the portion corresponding to the second portion 202 is remained. Accordingly, the second portion 202 having the second thickness T2 is only positioned on the back surface of the semiconductor substrate 10. One or more of various methods (for example, using an etching paste, etching using a photolithography, using a laser, and so on) may be applied to the patterning method. In the embodiment of the invention, it is exemplified that the tunneling forming layer 202a is entirely formed and then is patterned. However, the embodiment of the invention is not limited thereto. Therefore, the tunneling forming layer 202a may be formed only at a portion corresponding to the second portion 202 by using a mask or a mask layer, and then, the tunneling forming layer 202a may be used for the second portion 202 as it is. Various modifications are possible.

Next, as shown in FIG. 3d, the first portion 201 is formed at a portion where the second portion 202 is not formed. For example, a silicon oxide layer may be naturally formed on a surface of the semiconductor substrate 10 (that is, a portion of the back surface of the semiconductor substrate 10 where the second portion 202 is not formed) by a chemical reaction with the semiconductor material (for example, silicon) of the semiconductor substrate 10 and external oxygen through a thermal oxidation when the semiconductor substrate 10 is heat-treated at a predetermined temperature. The silicon oxide layer may constitute the first portion 201. The first portion 201 is formed by the thermal oxidation as in the above, and thus, the first portion 202 having a small thickness is formed over an entire portion where the second portion 202 is not formed by a simple process not using a mask and not including a patterning process.

In the embodiment of the invention, the first portion 201 and the second portion 202 are formed by different processes, and thus, the first portion 201 and the second portion 202 may include the same material and different materials to each other.

Figure 4A:
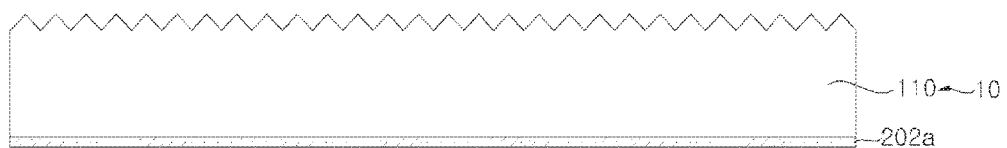
FIGS. 4a and 4b are sectional views illustrating a process for forming a tunneling layer of a method for manufacturing a solar cell according to a modified embodiment of the invention.
Figure 4B:
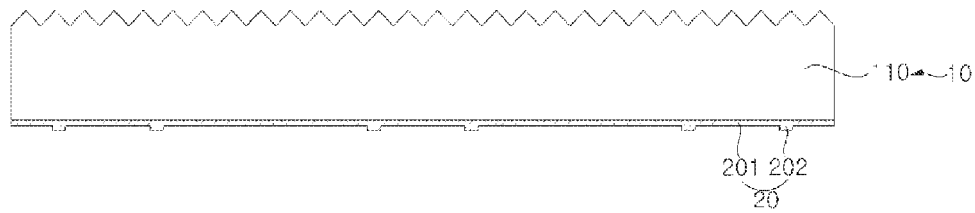

The tunneling layer 20 including the first and second portions 201 and 202 may be formed by one or more of various methods different from the above method. A modified embodiment of the invention will be described with reference to FIGS. 4a and 4b. As shown in FIG. 4a, the tunneling forming layer 202a having the second thickness T2 is formed on an entire portion of the back surface of the semiconductor substrate 10. Then, as shown in FIG. 4b, a portion corresponding to the first portion 201 is etched to have the first thickness T1 (refer to FIG. 1), and thereby forming the first portion 201 having the first thickness T1. The etching of the portion corresponding to the first portion 201 may be performed with a controlled etching rate by using a mask or a mask layer so that a portion corresponding portion 202 is not etched. Then, the tunneling layer 20 including the first and second portions 201 and 202 can be formed by a simple process. In this instance, the first and second portions 201 and 202 are formed by forming the same tunneling forming layer 202a, and thus, the first and second portions 201 and 202 have the same material and constitute a single layer having an integrated structure. The other modifications are possible.

Figure 3E:
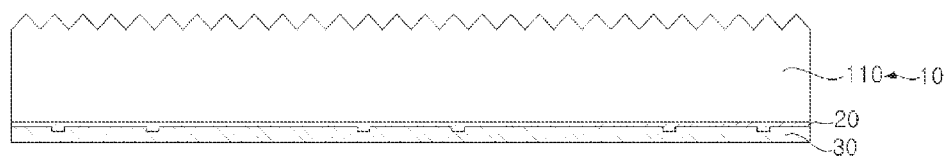
Figure 3F:
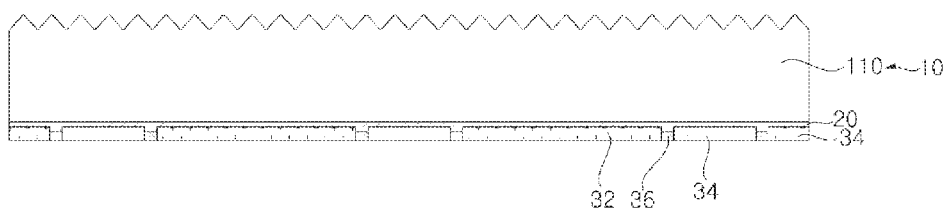

Then, as shown in FIGS. 3e and 3f, the first conductive type region 32 and the second conductive type region 34 are formed on the tunneling layer 20. This will be described in more detail.

As shown in FIG. 3e, a semiconductor layer 30 is formed on the tunneling layer 20. The conductive type regions 32 and 34 may be formed of an amorphous, microcrystalline, or polycrystalline semiconductor. In this instance, the semiconductor layer 30 may be formed by a method, for example, thermal growth, deposition (for example, plasma-enhanced chemical vapor deposition chemical (PECVD)) or the like. However, the embodiment of the invention is not limited thereto, the semiconductor layer 30 may be formed by various methods.

Next, as shown in FIG. 3f, first conductive type regions 32, second conductive type regions 34, and barrier areas 36 are formed at the semiconductor layer 30. For example, a region of the semiconductor layer 30 is doped with a first conductive type dopant to form the first conductive type region 32 by various methods such as an ion implantation method, a thermal diffusion method, or a laser doping method, and another region thereof is doped with a second conductive type dopant to form the second conductive type region 34 by various methods such as an ion implantation method, a thermal diffusion method, or a laser doping method. Then, the barrier region 36 may be formed in a region of the semiconductor layer 30 between the first and second conductive type regions 32 and 34.

However, the embodiment of the invention is not limited thereto. Various methods may be used for a method for forming the conductive type regions 32 and 34, and barrier region 36. Also, the barrier region 36 may be not formed. That is, various modifications are possible.

Figure 3G:
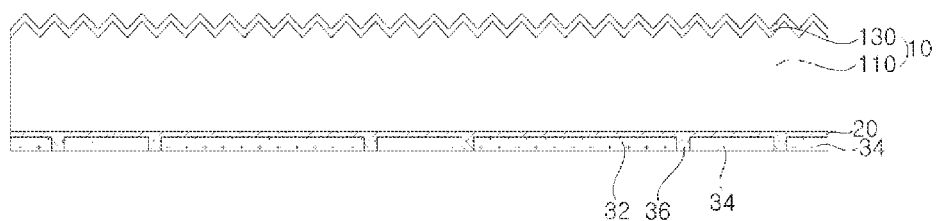

Next, as shown in FIG. 3g, a front surface field region 130 may be formed by doping the second conductive type dopant to the front surface of the semiconductor substrate 10. The front surface field region 130 may be formed by various methods, such as an ion implantation method, a thermal diffusion method, or a laser doping method. Also, the front surface field region 130 may be not additionally included.

Figure 3H:
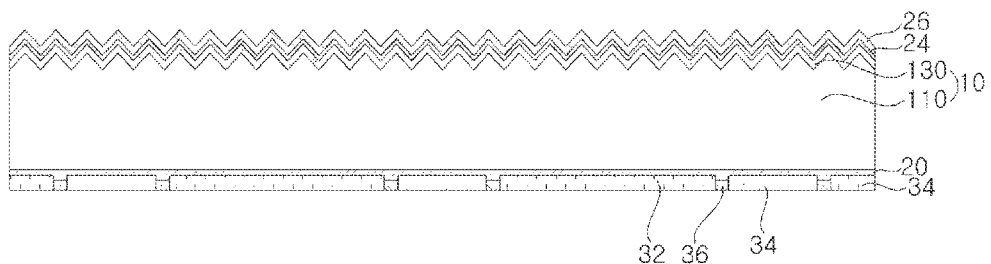

Next, as shown in FIG. 3h, a passivation layer 24 and an anti-reflective layer 26 are sequentially formed on the front surface of the semiconductor substrate 10, and an insulating layer 40 is sequentially formed on the rear surface of the semiconductor substrate 10. That is, the passivation layer 24 and the anti-reflective layer 26 are formed over the entire portion of the front surface of the semiconductor substrate 10, and the insulating layer 40 are formed over the entire portion of the rear surface of the semiconductor substrate 10. The passivation layer 24, the anti-reflective layer 26, and the insulating layer 40 may be formed by a variety of methods such as vacuum deposition, chemical vapor deposition, spin coating, screen printing or spray coating. A formation order of the passivation layer 24 and the anti-reflective layer 26, and the insulating layer 40 may be varied.

Figure 3I:
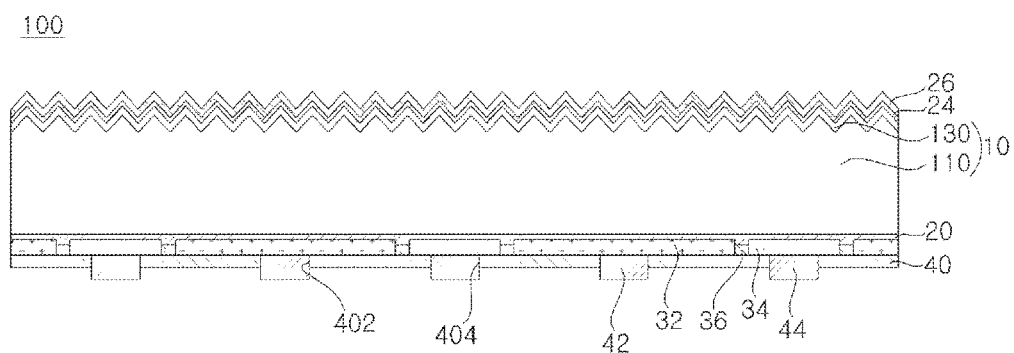

Next, as shown in FIG. 3i, the first and second electrodes 42 and 44 electrically connected respectively to the first and second conductive type regions 32 and 34 are formed.

In an embodiment of the invention, the first and second openings 402 and 404 are formed in the insulating layer 140, and the first and second electrodes 42 and 44 may be formed in the first and second openings 402 and 404 by various methods such as plating, deposition, or the like. In another embodiment of the invention, the first and second electrodes 42 and 44 having the above-described shapes may be formed by respectively applying pastes for forming first and second electrodes on the insulating layer 40 by screen-printing or the like and performing fire through, laser firing contact, or the like thereon. In this case, when the first and second electrodes 42 and 44 are formed, the first and second openings 402 and 404 are formed, and thus, a separate process of forming the first and second openings 402 and 404 need not be performed.

According to the embodiment of the invention, the tunneling layer 20 having the first and second portions 201 and 202 can be easily formed. Accordingly, the solar cell 100 having an improved structure may be easily manufactured using simplified manufacturing processes.

Hereinafter, with reference to FIGS. 5 to 9, solar cells according to other embodiments of the invention and methods for manufacturing the solar cells will be described in detail. A detailed description of the same or similar elements as those in the foregoing description will be omitted herein and a detailed description of only different elements will be provided herein. The combination of the foregoing embodiment and the modified embodiments thereof and the following embodiments and the modified embodiments thereof fall within the spirit and scope of the embodiment of the invention.

Figure 5:
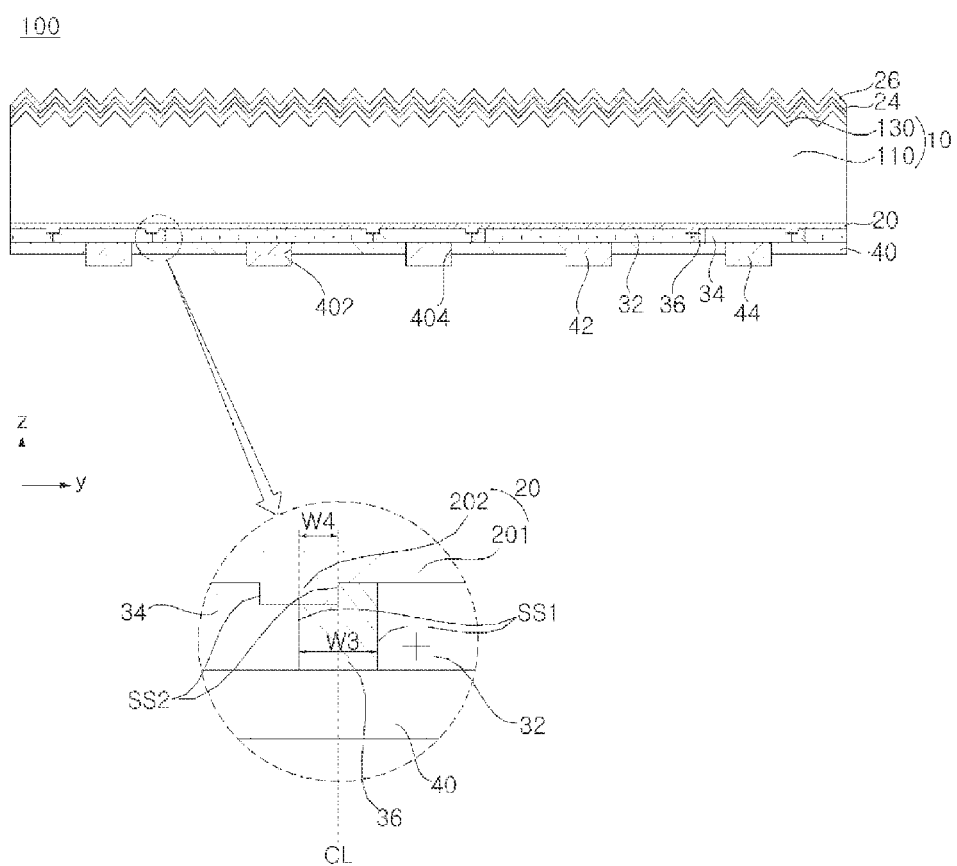
FIG. 5 is a sectional view of a solar cell according to another embodiment of the invention.

FIG. 5 is a sectional view of a solar cell according to another embodiment of the invention.

Referring to FIG. 5, in the embodiment of the invention, side surfaces SS2 of the second portion 202 may be deviated from or be misaligned with side surfaces SS1 of the barrier region 36. In this instance, both side surfaces S22 of the second portion 202 may be deviated from or be misaligned with both side surfaces SS1 of the barrier region in the sectional view. Selectively, in the sectional view, one of the both side surface S22 of the second portion 202 may be aligned with one of the side surfaces SS1 of the barrier region, and the other of the both side surface S22 of the second portion 202 may be aligned with the other of the side surfaces SS1 of the barrier region.

The side surfaces SS2 of the second portion 202 and the side surfaces SS1 of the barrier region 36 may be deviated from or be misaligned with each other by the different widths of the barrier region 36 and the second portion 202. Also, the side surfaces SS2 of the second portion 202 and the side surfaces SS1 of the barrier region 36 may be deviated from or be misaligned with each other on purpose or by a process error even when the widths of the barrier region 36 and the second portion 202 are different.

It is exemplified that the second portion 202 is formed to correspond to the first conductive type region 32 or is formed to overlap with the first conductive type region 32 in the embodiment of the invention. More particularly, a part or a section of the second portion 202 is positioned between the semiconductor substrate 10 and the barrier region 36, and the other part or section of the second portion 202 is positioned between the semiconductor substrate 10 and the first conductive type region 32.

In the instance, as shown in FIG. 5, the second portion 202 is partially formed between the semiconductor substrate 10 and the barrier region 36. The second portion 202 may be positioned to include an imaginary center line CL between the first conductive type region 32 and the second conductive type region 34 in the barrier region 36. That is, a width W4 of the portion of the second portion 202 positioned between the semiconductor substrate 10 and the barrier region 36 is about 50% or more of a width W3 of the barrier region 36. Thereby, the carrier tunneling to a portion of the barrier region 36 adjacent to the first conductive type region 32 can be prevented. Unlike in FIG. 5, the second portion 202 may be entirely positioned between the semiconductor substrate 10 and the barrier region 36.

As in the above, when the second portion 202 is formed to correspond to the first conductive type region 32 and not to correspond to the second conductive type region 34 (that is, the second portion 202 protrudes toward the first conductive type region 32 or overlaps the first conductive type region 32 more than the second conductive type region 34, the recombination that may be induced by a combining of the majority carrier of the semiconductor substrate 10 transferred to the barrier region 36 by the tunneling and the majority carrier of the first conductive type region 32 can be effectively prevented. The properties of the solar cell 100 are not deteriorated when the majority carrier of the semiconductor substrate 10 is transferred to the barrier region 36 by the tunneling and is transferred to the second conductive type region 34. Thus, it is not a problem that the second portion 202 does not correspond to or overlap with the second conductive type region 34. However, the embodiment of the invention is not limited thereto. Thus, in a modified embodiment of the invention, the second portion 202 may overlap with or correspond to the second conductive type region 34 (that is, may be disposed between the second conductive type region 34 and the semiconductor substrate 10), not the first conductive type region 34.

Figure 6:
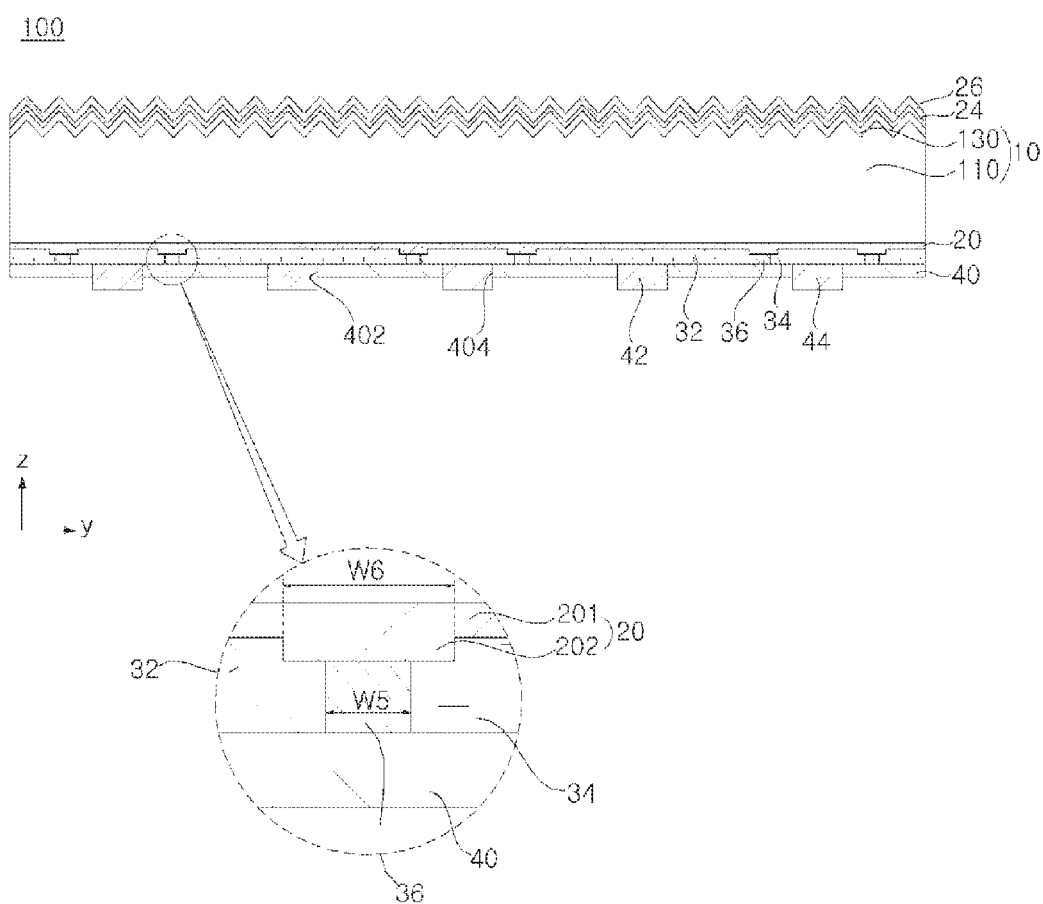
FIG. 6 is a sectional view of a solar cell according to yet another embodiment of the invention.

As another embodiment of the invention, as shown in FIG. 6, the second portion 202 may overlap with or correspond to both of the first and second conductive type regions 32 and 34. Then, the second portion 202 includes a section between the semiconductor substrate 10 and the barrier region 36, another section between the semiconductor substrate 10 and the first conductive type region 32, and yet another section between the semiconductor substrate 10 and the second conductive type region 34.

When a width W6 of the second portion 202 is larger or greater than a width of the barrier region 36, the second portion 202 is positioned over an entire portion of the barrier 36 even though a process error (manufacturing error) exists. Thus, the carrier tunneling toward the barrier region 36 can be effectively prevented.

In this instance, the ratio W5:W6 of the width W5 of the barrier region 36:the width W6 of the second portion 202 may be in a range from about 1:1.1 to about 1:2.5. When the ratio W5:W6 is smaller than 1:1.1, the second portion 202 may not correspond to the entire portion of the barrier region 36 if there is the process error. When the ratio W5:W6 is larger than 1:2.5, the carrier tunneling to the first and second conductive type regions 32 and 34 can be hindered since the width W6 of the second portion 202 may be excessively large. However, the embodiment of the invention is not limited thereto, and thus, the ratio W5:W6 may be varied.

In the embodiment of the invention, an imaginary center line of the second portion 202 is aligned or collinear with an imaginary center line of the barrier region 36, and the second portion 202 is symmetrically positioned with respect to the barrier region 36. Then, a width of a portion of the second portion 202 corresponding to the first conductive type region 32 is the same as a width of another portion of the second portion 202 corresponding to the second conductive type region 34. However, the embodiment of the invention is not limited thereto. Thus, the second portion 202 may lean the first conductive type region 32, and the width of the portion of the second portion 202 corresponding to the first conductive type region 32 may be larger than the width of the another portion of the second portion 202 corresponding to the second conductive type region 34. Then, the recombination between the first conductive type region 32 and the barrier region 36 can be more effectively prevented. Selectively, the second portion 202 shifted to or protrudes toward the second conductive type region 34 or overlaps the first conductive type region 32 more than the second conductive type region 34, and the width of the portion of the second portion 202 corresponding to the first conductive type region 32 may be smaller than the width of the another portion of the second portion 202 corresponding to the second conductive type region 34. Other various modifications may be possible.

Figure 7:
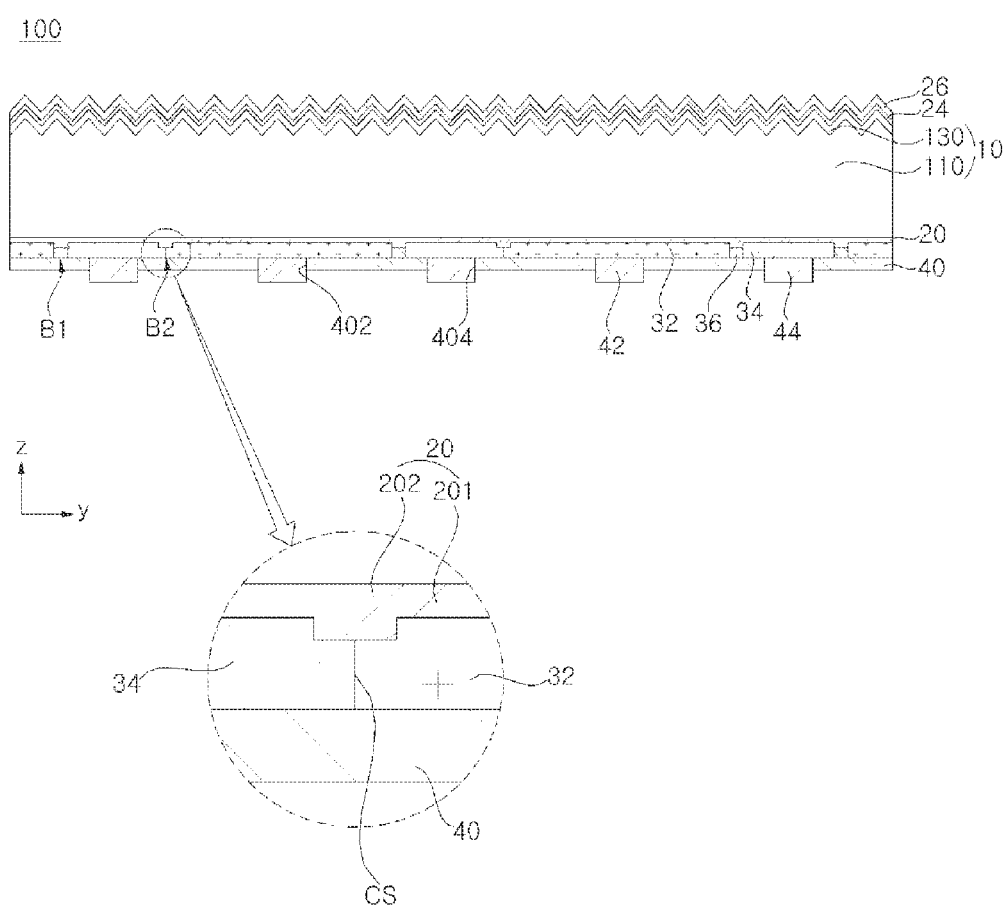
FIG. 7 is a sectional view of a solar cell according to still another embodiment of the invention.
Figure 8:
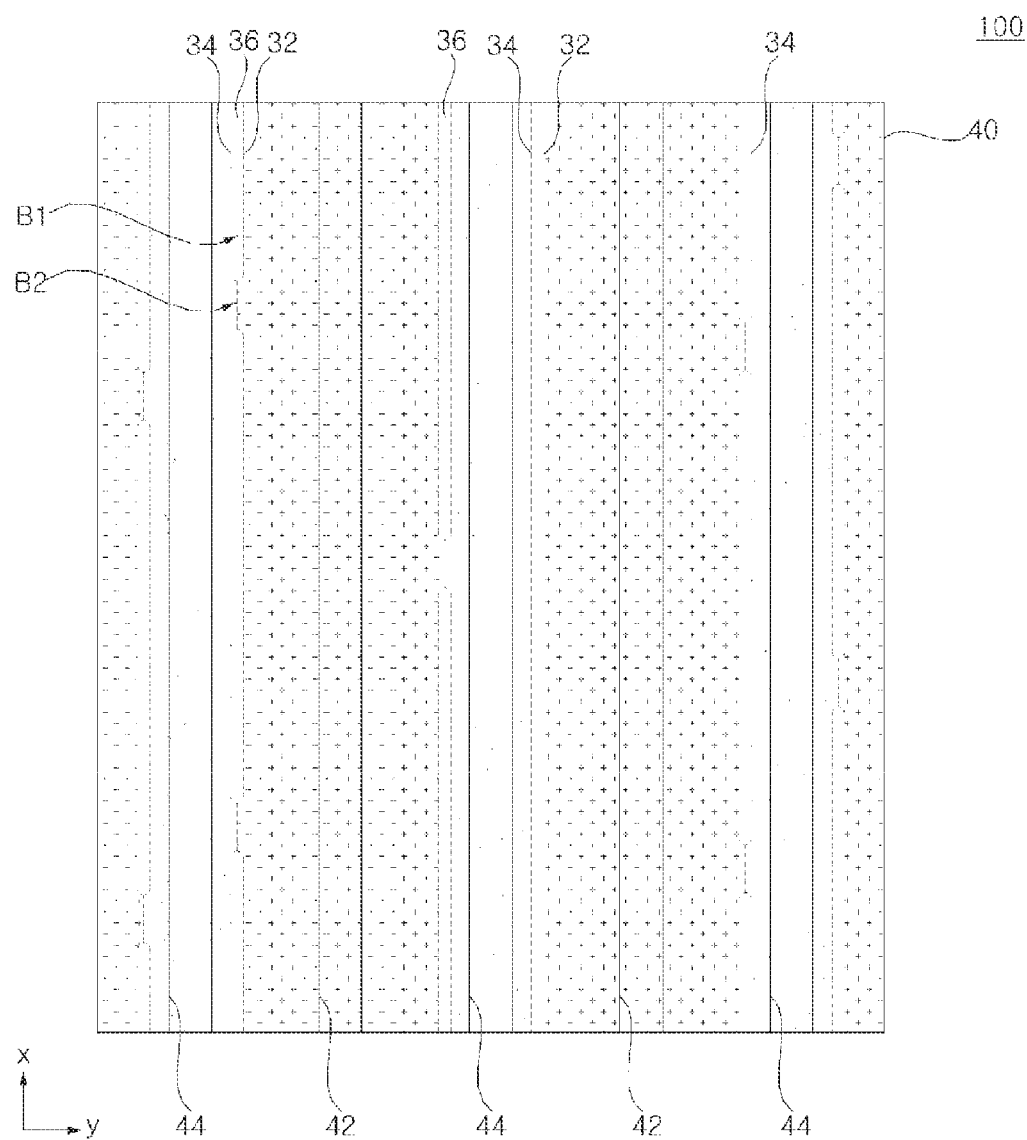
FIG. 8 is a partial rear plan view of the solar cell illustrated in FIG. 7.

FIG. 7 is a sectional view of a solar cell according to still another embodiment of the invention, and FIG. 8 is a partial rear plan view of the solar cell illustrated in FIG. 7.

Referring to FIGS. 7 and 8, in the embodiment of the invention, the first conductive type region 32 is in contact with the second conductive type region 34 at at least a part of the boundary portion between the first conductive type region 32 and the second conductive type region 34. That is, the boundary portion includes a first boundary B1 and a second boundary (or contact boundary) B2. In the first boundary B1, the barrier region 36 is positioned between the first conductive type region 32 and the second conductive type region 34. In the second boundary B2, the barrier region 36 is not formed, and the first conductive type region 32 is in contact with the second conductive type region 34.

When there is the second boundary B2 where the barrier region 36 is not formed and the first conductive type region 32 is in contact with the second conductive type region 34, the second boundary B2 provides a path that the electricity can pass through and problems that are induced by the heat concentrated at a local portion can be prevented. Thus, the problems of the solar cell 100 by the heat can be minimized. However, if the ratio of the second boundary B2 is too large, the problem due to the shunt between the first conductive type region 32 and the second conductive type region 34 may be large. Thus, the ratio of the second boundary B2 may be smaller than about 50% (for example, 10% or less). However, the embodiment of the invention is not limited thereto, and the ratio of the second boundary B2 may be varied.

The relationships in position between the first boundary B1 and the second portion 202 is the same as the descriptions in the above embodiments of the invention, and the detailed descriptions thereof will be omitted. In the second boundary B2, the contact surface C2 between the first conductive type region 32 and the second conductive type region 34 may be positioned on the second portion 202. However, the embodiment of the invention is not limited thereto, and thus, various modifications are possible.

Figure 9:
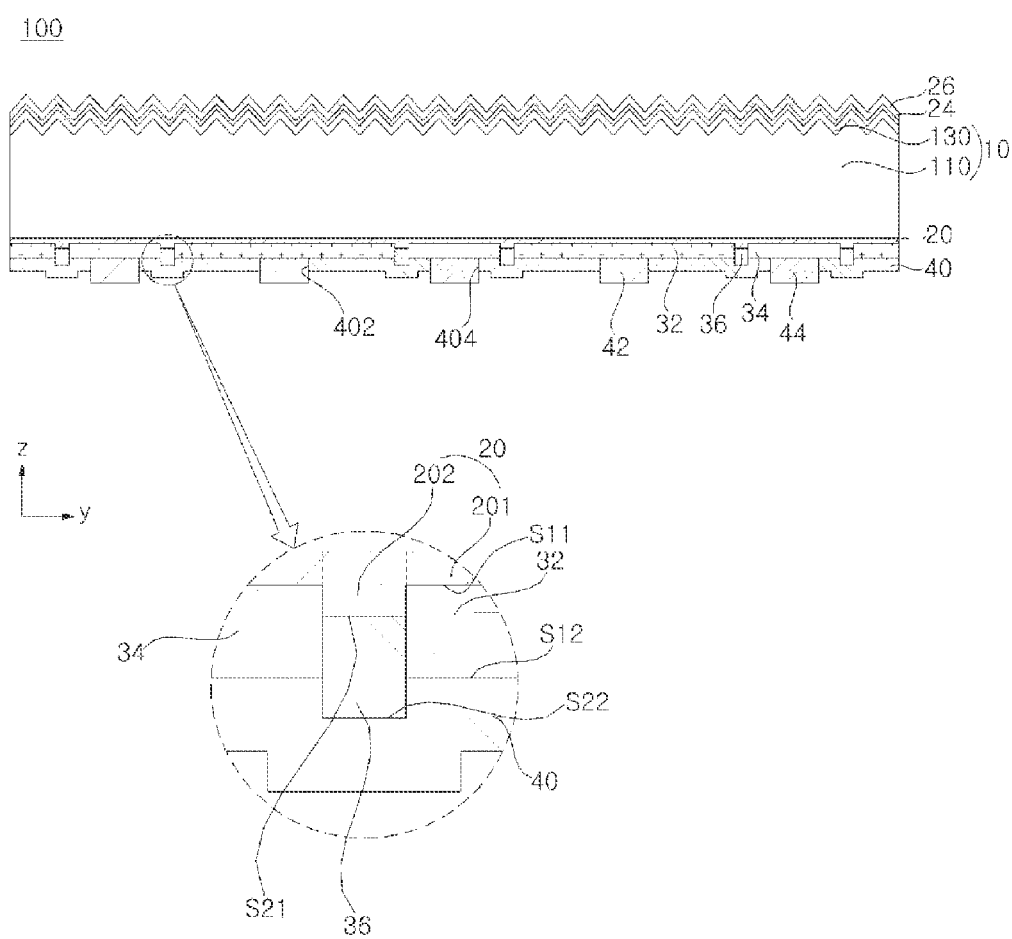
FIG. 9 is a sectional view of a solar cell according to still yet another embodiment of the invention.

FIG. 9 is a sectional view of a solar cell according to still yet another embodiment of the invention.

Referring to FIG. 9, a semiconductor layer including first and second conductive type regions 32 and 34, and a barrier region 36 is formed to have a curve (or protruded and depressed portions) according to a curve (or protruded and depressed portions) of the tunneling layer 20.

More particularly, a first surface S21 of the barrier region 36 on the second portion 202 is protruded to the semiconductor substrate 10 more than a first surface S11 of the first and second conductive type regions 32 and 34 on the first portion 201. Also, a step or a gap is positioned between a second surface S22 of the barrier region 36 opposite to the first surface a second surface S21 of the first and second conductive type regions 32 and 34 opposite to the first surface S11. Accordingly, the second surface S22 of the barrier region 36 on the second portion 202 is protruded to the semiconductor substrate 10 more than the second surface S12 of the first and second conductive type regions 32 and 34 on the first portion 201.

The second portion 202 and the barrier region 36 shown in FIG. 9 have arrangements the same as those shown in FIG. 1. However, the embodiment of the invention is not limited thereto, and thus, various modifications are possible.

Particular characteristics, structures, or effects described in connection with the embodiments of the invention are included in at least one embodiment of the embodiments of the invention and not necessarily in all embodiments of the invention. Furthermore, the particular characteristics, structures, or effects of any specific embodiment of the embodiments of the invention may be combined in any suitable manner with one or more other embodiments of the invention or may be changed by those skilled in the art to which the embodiments of the invention pertain. Therefore, it is to be understood that contents associated with such combination or change fall within the spirit and scope of the embodiments of the invention.

Although embodiments of the invention have been described with reference to a number of illustrative embodiments of the invention, it should be understood that numerous other modifications and applications may be devised by those skilled in the art that will fall within the intrinsic aspects of the embodiments of the invention. More particularly, various variations and modifications are possible in concrete constituent elements of the embodiments of the invention. In addition, it is to be understood that differences relevant to the variations and modifications fall within the spirit and scope of the embodiment of the invention defined in the appended claims.

What is claimed is:

1. A solar cell, comprising:
a semiconductor substrate;
a tunneling layer on one surface of the semiconductor substrate;
a first conductive type region on the tunneling layer, the first conductive type region having a first conductive type;
a second conductive type region on the tunneling layer, the second conductive type region having a second conductive type;
a first electrode and a second electrode, the first electrode connected to the first conductive type region and the second electrode connected to the second conductive type region; and
a barrier region on the tunneling layer, wherein the barrier region is disposed at at least a part of a boundary portion between the first conductive type region and the second conductive type region,
wherein the tunneling layer comprises a first portion and a second portion,
the first portion is disposed to correspond to at least a part of the first and second conductive type regions and has a first thickness,
the second portion is disposed to correspond to the boundary portion between the first conductive type region and the second conductive type region, and
the second portion has a second thickness greater than the first thickness,
wherein the second portion is disposed to correspond to at least a part of the barrier region,
wherein a step or a gap is formed between a first surface of the barrier region on the second portion and a first surface of the first and second conductive type regions on the first portion,
wherein the tunneling layer is disposed between the semiconductor substrate and the first and second conductive type regions,
wherein a width of the second portion is the same with a width of the barrier region,
wherein the second portion comprises at least one of silicon oxide, silicon nitride, silicon carbide, and aluminum oxide, and
wherein the barrier region includes an intrinsic semiconductor.

2. The solar cell according to claim 1, wherein the first surface of the first and second conductive type regions is protruded toward the semiconductor substrate more than the first surface of the barrier region.

3. The solar cell according to claim 2, wherein a second surface of the barrier region opposite to the first surface of the barrier region is flush with a second surface of the first and second conductive type regions opposite to the first surface of the first and second conductive type regions, or
wherein a step or a gap is formed between the second surface of the barrier region and the second surface of the first and second conductive type regions.

4. The solar cell according to claim 1, wherein side surfaces of the barrier region are flush with side surfaces of the second portion.

5. The solar cell according to claim 1, wherein side surfaces of the barrier region are misaligned with side surfaces of the second portion.

6. The solar cell according to claim 5, where a part of the second portion overlaps with at least one of the first and second conductive type regions.

7. The solar cell according to claim 6, wherein the semiconductor substrate comprises a base region having the second conductive type,
the second portion protrudes toward the first conductive type region, and
the second portion includes a first section between the semiconductor substrate and the barrier region, and a second section between the semiconductor substrate and the first conductive type region.

8. The solar cell according to claim 6, wherein a width of a section of the second portion between the barrier region and the semiconductor substrate is about 50% or more of a width of the barrier region.

9. The solar cell according to claim 7, wherein the first conductive type is a p-type, and the second conductive type is an n-type.

10. The solar cell according to claim 1, wherein the boundary portion between the first conductive type region and the second conductive type region comprises a contact boundary where the first conductive type region is in contact with the second conductive type region.

11. The solar cell according to claim 1, wherein a contact surface between the first conductive type region and the second conductive type region is positioned on the second portion.

12. The solar cell according to claim 1, wherein the boundary portion between the first conductive type region and the second conductive type region comprises:
a first boundary where the barrier region is interposed between the first conductive type region and the second conductive type region; and
a second boundary where the first conductive type region is in contact with the second conductive type region.

13. The solar cell according to claim 1, wherein the first portion comprises at least one of silicon oxide, silicon nitride, silicon carbide, and aluminum oxide.

14. The solar cell according to claim 1, further comprising:
an insulating layer on the first conductive type region and the second conductive type region; and
a passivation layer on the other surface of the semiconductor substrate,
wherein the second thickness is lesser than each of thicknesses of the first and second conductive type regions, the insulating layer, and the passivation layer.

15. The solar cell according to claim 1, wherein the first thickness is in a range from about 0.5 nm to about 5 nm, and the second thickness is in a range from about 2 nm to about 100 nm.

16. The solar cell according to claim 1, wherein the barrier region and the second portion of the tunneling layer contacts at the first surface of the barrier region.

\* \* \* \* \*